United States Patent

[11] 3,555,300

[72] Inventor Per T. Overlie
Chicago, Ill.

[21] Appl. No. 639,977
[22] Filed May 22, 1967
[45] Patented Jan. 12, 1971
[73] Assignee Warwick Electronics Inc.
a corporation of Delaware

[54] LIMITER CIRCUIT
2 Claims, 1 Drawing Fig.

[52] U.S. Cl. .......... 307/237, 328/171; 329/131; 330/30
[51] Int. Cl. .......... H03k 5/08
[50] Field of Search .......... 307/237; 328/171; 329/131; 330/30D, 69

[56] References Cited

UNITED STATES PATENTS

| | | | |
|---|---|---|---|
| 2,985,836 | 5/1961 | Hatton | 307/237X |
| 3,137,826 | 6/1964 | Boudrias | 330/30D |
| 3,303,425 | 2/1967 | Pendleton | 328/165 |
| 3,310,688 | 3/1967 | Ditkafsky | 307/237X |
| 3,361,981 | 1/1968 | Wolcott | 330/69X |
| 3,395,358 | 7/1968 | Petersen | 330/69X |
| 3,395,359 | 7/1968 | Zacher | 330/30D |
| 3,209,222 | 9/1965 | Holy | 307/215X |
| 3,479,644 | 11/1969 | Spaid | 307/215X |

OTHER REFERENCES

Skarshinki, " Amplitude Limiting Amplifer", IBM Technical Disclosure Bulletin, Vol. 8 No. 6, Nov. 1965

*Primary Examiner*—Donald D. Forrer
*Assistant Examiner*—R. L. Woodbridge
*Attorney*—Hofgren, Wegner, Allen, Stellman & McCord

ABSTRACT: An FM receiver having an amplitude limiter with a pair of diodes for clipping positive and negative going portions of a signal and a semiconductor circuit providing a high-input impedance to the dual diodes and having a constant current output. The semiconductor circuit has a pair of emitter coupled transistors connected to a third transistor connected as a constant current source.

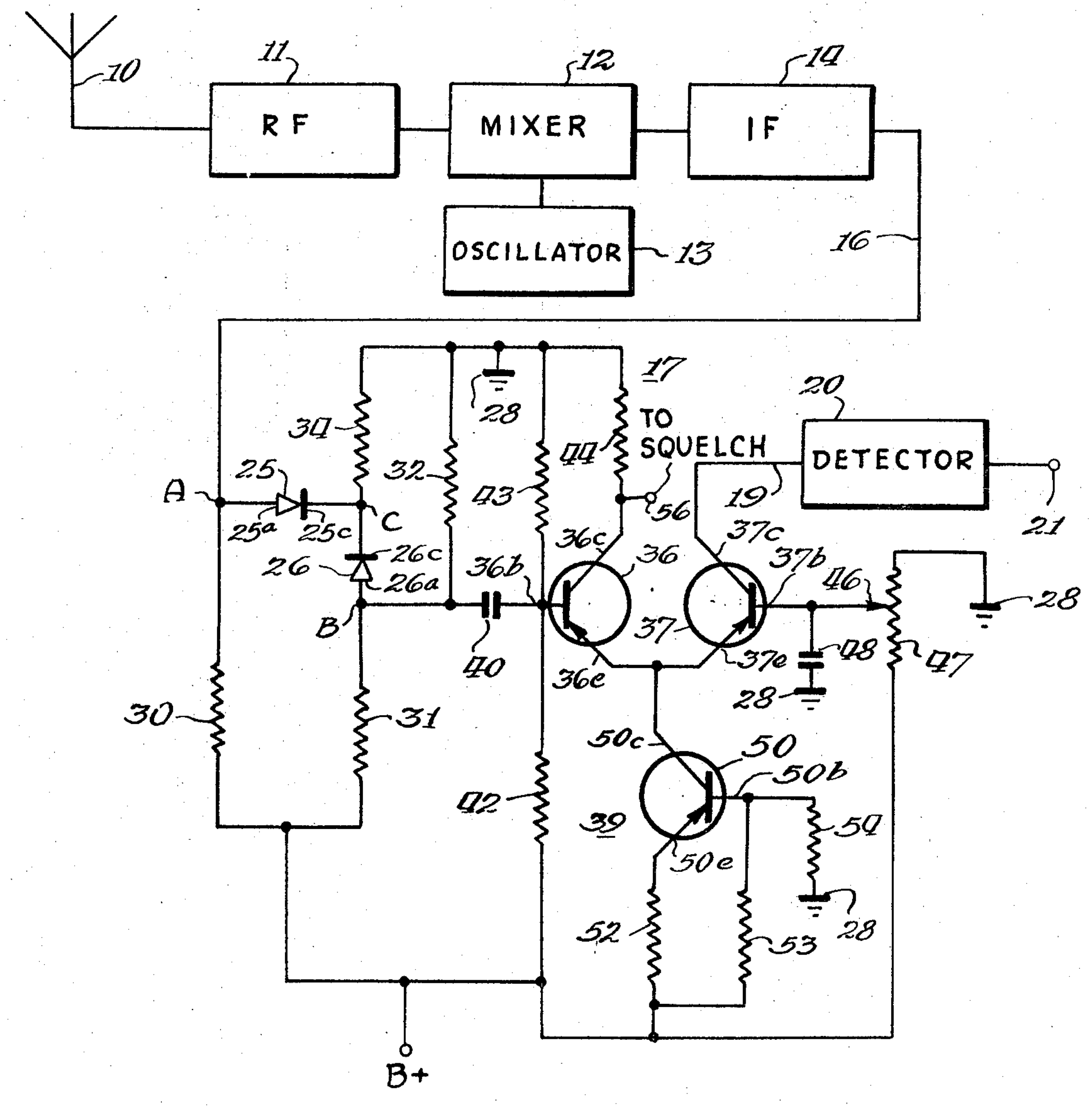
INVENTOR
Per T Overlie
BY Hofgren, Wegner, Allen, Stellman & McCord
ATTORNEYS

LIMITER CIRCUIT

Certain aspects of the illustrated circuit are being claimed in a copending patent application of the applicant, entitled "Squelch Circuit," filed on even date with this application.

This invention relates to a circuit for amplitude limiting a signal.

The limiter circuit may be used in many systems, but will be described here as incorporated in an FM receiver, where amplitude variations in a demodulated FM signal are to be eliminated. In accordance with the invention, the limiter circuit clips both positive and negative going portions of a signal, the potentials of which exceed predetermined values, removing all amplitude variations from the signal. A high-input impedance semiconductor circuit having a constant current output passes the clipped waveforms without distortion to the detector stage of the FM receiver.

One object of the invention is to provide an improved amplitude limiter circuit.

Another object of the invention is to provide a limiter circuit which clips positive and negative going portions of a signal and passes the clipped signal without distortion to other circuitry.

One feature of the invention is the provision of a limiter circuit having diodes for clipping the positive and negative going portions of a signal, which diodes are coupled to a high-input impedance semiconductor circuit for isolating the diodes from effects of loading.

Another feature of the invention is the provision of a limiter circuit including semiconductor devices connected to provide a high-input impedance and a constant current output which passes the amplitude clipped waveform without distortion.

Further features and advantages of the invention will be apparent from the following specification and from the drawings, in which the single FIG. is a partly block and partly schematic diagram of a circuit embodying the invention.

While an illustrative embodiment of the invention is shown in the drawing and will be described in detail herein, the invention is susceptible of embodiment in several different forms and it should be understood that the present disclosure is to be considered as an exemplification of the principles of the invention and is not intended to limit the invention to the embodiment illustrated. Throughout the description of the circuit, values and type designations will be given for certain of the components in order to disclose a complete, operative embodiment of the invention. However, these values and type designations are merely illustrative and are not critical unless specifically so stated. The scope of the invention will be pointed out in the appended claims.

In the single figure, the invention is illustrated in the limiter circuit of an FM receiver. The receiver has an antenna 10 coupled to a radio frequency (RF) amplifying section 11. The amplified signals are connected to a mixer 12 and oscillator 13 to produce an intermediate frequency (IF) signal at 10.7 megacycles, as is conventional in FM receivers. The IF signal is coupled to an IF amplifying section 14 which has an output at 16 connected to a limiter circuit 17, to be discussed in detail hereafter, for amplitude limiting the IF signal. An output 19 of limiter circuit 17 is connected to a FM detector 20, which may, for example, be of the discriminator type, for demodulating the amplitude limited IF signal to recover the intelligence contained therein. Detector 20 has an audio output at 21 for connection to other stages of an FM receiver, such as audio amplifiers.

The RF and IF sections 11 and 14 may be of the AGC controlled type disclosed in a copending patent application of the applicant, Forward and Delayed Reverse Automatic Gain Control Circuit, Ser. No. 638,978 filed May 22, 1967.

Considering limiter 17 in more detail, the output 16 from IF section 14 is coupled to a pair of 1N295 diodes 25 and 26 which are connected in a resistive voltage divider circuit between a source of positive DC potential of B+, al. 11.5 volts, and a source of reference potential or ground 28. More particularly, a 5.6 kilohm resistor 30 is coupled between B+ and an anode **25*a* of diode 25. A 1.8 kilohm resistor 31 and a 3.3 kilohm resistor 32 are connected in series between b+ and ground 28. The junction of resistors 31 and 32 is connected to the anode 26*a* of diode 26. The cathodes 25*c* and 26*c* of diodes 25 and 26, respectively, are connected through a 3.9 kilohm resistor 34 to ground 28. For purposes of explaining the operation of the circuit, the junction point between diode 25 and resistor 30 is labeled A, the junction point between diode 26 and resistor 31 is labeled B, and the junction point between the two diodes and resistor 34 is labeled C. Junction A is connected to the output 16 of IF section 14**.

In operation, diode 25 clips the negative-going portion of the IF waveform from output 16 while diode 26 clips the positive going portion of the IF waveform. The clipping level is determined by the values of the resistors in the diode network circuit. Resistors 31 and 32 form a voltage divider which fixes the DC potential at junction point B. A parallel current path is formed from B+ through resistor 30 and diode 25 to resistor 34, and through resistor 31 and diode 26 to resistor 34. This path establishes fixed DC voltage at junction points A and C for the "no signal" condition of the receiver.

When the IF signal at 16 has a negative-going portion which reaches or exceeds the potential at junction C, diode 25 is driven into its reverse bias condition and is cut off. The diode 26, however, remains conducting and the potential at junction B is therefore fixed at a constant level determined by the voltage divider resistor 31 in series with paralleled resistors 32 and 34.

Diode 26 operates in a similar manner to limit the positive-going portion of the IF signal. The positive-going signal causes diode 25 to conduct more heavily, raising the potential at junction point C. When the positive-going signal causes junction C to become more positive than junction B, diode 26 is reverse biased and the potential at junction point B remains fixed at a value determined by the resistors 31 and 32.

Junction point B is coupled to a semiconductor circuit which has a high-input impedance and a constant current output for passing the clipped waveform without distortion to detector 20. The semiconductor circuit consists of a pair of PNP transistors 36 and 37, type TI403, connected in a common emitter circuit with a constant current source 39.

More particularly, the base **36*b* of transistor 36 is coupled through a 0.1 microfarad capacitor 40 to junction point B. The bias on base 36*b* is determined by a pair of resistors 42 and 43, 5.6 kilohms and 15 kilohms, respectively, which are connected in a series between B+ and ground 28. The junction of resistors 42 and 43 is connected directly to the base 36*b*. The collector 36*c* of the transistor 36 is connected through a 1 kilohm resistor 44 to ground 28. The emitter 36*e* of transistor 36 is directly connected to the emitter 37*e* of transistor 37. The collector 37*c* of transistor 37 corresponds with output 19, and is directly connected to detector section 20 of the FM receiver. The operating point of transistor 37 is determined by the base bias voltage at a tap 46 on a 50 kilohm potentiometer resistor 47 connected between B+ and ground 28. Tap 46 is set to maintain transitor 37 at a substantially constant current operating point for the range of collector to emitter voltages impressed across the transistor by the preceding portion of the limiter circuit. The resulting constant collector current at output 19 aids the amplitude limiting action of the circuit, and is especially desirable for detectors having transformer coupling or other current responsive devices. The base 37*b* of transistor 37 is bypassed to ground 28 through a 0.1 microfarad capacitor 48**.

Current source 39 serves as a common emitter resistor for both transistors 36 and 37. A PNP transistor 50, type TI403, has its collector **50*c* directly connected to the emitters of transistors 36 and 37. The emitter 50*e* of transistor 50 is connected through a 100 ohm resistor 52 to B+. A pair of resistors 53 and 54, 2.7 kilohms and 39 kilohms respectively, are connected in series between B+ and ground 28. The junction of resistors 53 and 54 is directly connected to the base 50*b* of transistor 50**.

The input impedance of transistor 36, between base 36*b* and B+, has a high value which prevents loading of the diode circuit, thus passing the clipped waveform without distortion. Source 39 provides the necessary current to the emitters of transistors 36 and 37, while also increasing the input impedance of transistor 36. As a further feature of the circuit, the load resistor 44 of transistor 36 has a voltage thereacross, between one side 56 of resistor 44 and ground 28, which is suitable to operate a squelch circuit (not illustrated) without loading the limiter. The operation of the illustrated circuit, insofar as it relates to a squelch circuit, is described and claimed in a copending application of the applicant, entitled "Squelch Circuit," filed on even date with the present application.

I claim:

1. An amplitude limiting circuit for signals having positive and negative-going portions, said amplitude limiting circuit having a high input impedance output network coupled to the output of said amplitude limiting circuit, wherein said amplitude limiting circuit comprises:

a source of DC potential having first and second terminals;
first and second diodes;
first, second, third and fourth impedances;
means connecting said first and second impedances in series between said first and second terminals;
means connecting said third impedance, said second diode and said fourth impedance in series in the order named between said first and second terminals;
means connecting said first diode between the junction of said first and second impedances and the junction between said second diode and said fourth impedance, said first and second diodes being poled for forward conduction in the same direction with respect to the common junction therebetween;
the junction between said third impedance and said second diode comprising the input of said amplitude limiting circuit and being adapted to receive said signals, and said junction between said first and second impedances comprising the output of said amplitude limiting circuit; and
said high input impedance output network comprising first and second transistors each having a collector, base and emitter;
means coupling said base of said first transistor to said output of said amplitude limiting circuit;
means coupling said collector of said first transistor to said second terminal of said source of DC potential;
means coupling said emitters of said first and second transistors in common to said first terminal of said source of DC potential;
means coupling said base of said second transistor to a reference potential;
said collector of said second transistor comprising the output of said high input impedance output network.

2. The apparatus of claim 1 wherein said means coupling said emitters of said first and second transistors to said first terminal of said source of DC potential comprises a constant current source.